United States Patent
Atanackovic

(10) Patent No.: US 7,476,600 B1
(45) Date of Patent: Jan. 13, 2009

(54) FET GATE STRUCTURE AND FABRICATION PROCESS

(75) Inventor: Petar B. Atanackovic, Palo Alto, CA (US)

(73) Assignee: Translucent, Inc., Palo Alto, CA (US)

( * ) Notice: Subject to any disclaimer, the term of this patent is extended or adjusted under 35 U.S.C. 154(b) by 303 days.

(21) Appl. No.: 11/595,242

(22) Filed: Nov. 9, 2006

Related U.S. Application Data

(62) Division of application No. 11/068,222, filed on Feb. 28, 2005, now Pat. No. 7,432,569.

(51) Int. Cl.
*H01L 21/00* (2006.01)

(52) U.S. Cl. .............. 438/479; 438/482; 438/486; 438/488; 257/E21.133; 257/E21.191; 257/E21.197; 257/E21.413; 257/E21.414; 257/E23.151; 257/E23.154; 257/E23.193

(58) Field of Classification Search ......... 438/478–482, 438/486, 488; 257/E21.133, 191, 197, 413, 257/414, 415, 562, E23.151, 154, 293
See application file for complete search history.

(56) References Cited

U.S. PATENT DOCUMENTS 6,143,072 A * 11/2000 McKee et al. ............. 117/108
6,787,433 B2 * 9/2004 Mitani et al. ............. 438/479

* cited by examiner

*Primary Examiner*—Michael S Lebentritt
(74) *Attorney, Agent, or Firm*—Parsons & Goltry; Robert A. Parsons; Michael W. Goltry

(57) ABSTRACT

The invention includes a method of fabricating a gate structure for a field effect transistor and the gate structure. The method includes providing a crystalline silicon substrate and epitaxially growing a gate insulating layer of crystalline rare earth insulating material on the crystalline silicon substrate. A gate stack of crystalline silicon is then epitaxially grown on the layer of crystalline rare earth insulating material and doped to provide a desired type of conductivity. The gate insulating layer and the gate stack are etched and a metal electrical contact is deposited on the epitaxially grown gate stack of crystalline silicon to define a gate structure.

13 Claims, 1 Drawing Sheet

FET GATE STRUCTURE AND FABRICATION PROCESS

CROSS-REFERENCE TO RELATED APPLICATIONS

This application is a divisional of U.S. patent application Ser. No. 11/068,222, filed 28 Feb. 2005 now U.S. Pat. No. 7,432,569.

FIELD OF THE INVENTION

This invention relates to field effect transistors, and especially field effect transistor gate structures and gate stacks, and the fabrication process.

BACKGROUND OF THE INVENTION

Complimentary metal oxide semiconductor (CMOS) structures are the core active elements of modern electronics. Undoubtedly, the major material enabling features of Si CMOS are the superb quality of the native silicon dioxide ($SiO_2$), $Si/SiO_2$ interface and high crystalline perfection of the Si substrates. The field effect transistor (FET) implemented as CMOS is scalable. That is, speed and complexity improves with decreasing device feature sizes. This concept makes CMOS architecture a powerful methodology. Deep submicron room-temperature bulk Si CMOS is presently the main technology used for ultra large scale integrated circuits (ULSICs).

Because silicon is the major semiconductor material used in the semiconductor industry, silicon dioxide ($SiO_2$) is the major insulating material used in the gate insulating layer. Silicon dioxide is a natural material that can be easily grown thermally through a steam process. Also, the silicon dioxide forms a bond with the crystalline silicon active layer that determines most of the characteristics of the FET so that it is very difficult to change the insulating material of the gate insulating layer without having deleterious effects on the FET.

However, several problems do arise from the use of silicon dioxide as the gate insulating layer. Continued scaling of current CMOS architecture is reaching the limits of the material properties of both the $SiO_2$ gate dielectric and bulk Si substrate. As the length and thickness of the gate insulating layer is made smaller, defects and other materials in the gate insulating layer greatly affect the reliability, lifetime, and operating characteristics of the FET. Thus, any impurities in the gate stack, such as the dopant material used in doping of layers to produce the desired Schottky electrical contact of the gate, can cause serious problems. The impurities or doping materials are a problem because they migrate into the gate insulating layer and sometimes even into the active layer to produce defects and changes in operating characteristics.

Another problem with a silicon dioxide insulating layer on a layer of crystalline silicon is the strain produced by stress introduced at the junction by the lattice mismatch between the silicon and the thermally formed silicon dioxide. The lattice mismatch results in a relatively high compressive stress at the junction between the two materials. In many instances this high stress can result in dislocations, crystalline defects, and even fractures in the active layer. To provide an unstressed or unstrained active layer, the thickness of the silicon dioxide layer must be severely limited to a thickness at which the stress substantially disappears. That is, in each atomic layer of the silicon dioxide a small amount of the stress can be removed by lattice matching until, ultimately, all stress is removed (stress distribution). However, the result is a layer of silicon dioxide that is too thick to be of use in many applications, such as gate oxides in very small field effect transistors and the like.

It would be highly advantageous, therefore, to remedy the foregoing and other deficiencies inherent in the prior art.

Accordingly, it is an object of the present invention to provide a new and improved method of fabricating gate structures for field effect transistors and the like.

Another object of the invention is to provide new and improved gate structures for field effect transistors and the like.

Another object of the invention is to provide a new and improved method of fabricating gate structures to improve manufacturing consistency and consistent semiconductor component characteristics and to simplify the fabrication process.

A further object of the present invention is to provide gate structures for semiconductor components that improve the reliability, lifetime, and operating characteristics of the semiconductor components.

A further object of the present invention is to provide FET gate structures for semiconductor components that reduces the impurity diffusion from the gate contact layer into the gate oxide and or active layer.

SUMMARY OF THE INVENTION

Briefly, to achieve the desired objects of the instant invention in accordance with a preferred embodiment thereof, provided is a method of fabricating a gate structure for semiconductor components including providing a crystalline semiconductor substrate and epitaxially growing a gate insulating layer of crystalline rare earth insulating material on the semiconductor substrate. A gate stack of crystalline semiconductor material is then epitaxially grown on the layer of crystalline rare earth insulating material and doping of the gate stack of crystalline semiconductor material is performed to provide a desired type of conductivity. The gate insulating layer and the gate stack are etched to define the gate stack and a metal electrical contact is deposited on the gate stack.

In a specific embodiment, a method of fabricating a gate structure for a field effect transistor and the gate structure is disclosed. The method includes providing a crystalline silicon substrate and epitaxially growing a gate insulating layer of crystalline rare earth insulating material on the crystalline silicon substrate. A gate stack of crystalline silicon is then epitaxially grown on the layer of crystalline rare earth insulating material and doped to provide a desired type of conductivity. The gate insulating layer and the gate stack are etched and a metal electrical contact is deposited on the epitaxially grown gate stack of crystalline silicon to define a gate structure. The source and drain regions are either defined via implantation of dopant species or by the use rare-earth silicide and or transition metal silicide.

A gate structure for semiconductor components, such as FETs and the like, includes a crystalline semiconductor substrate with a gate insulating layer of crystalline rare earth insulator material on the semiconductor substrate and a gate stack of crystalline semiconductor material on the layer of crystalline rare earth insulating material. The gate stack of crystalline semiconductor material is doped to provide a desired type of conductivity and a metal electrical contact is deposited on the crystalline gate stack.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF A PREFERRED EMBODIMENT

Figure 1:
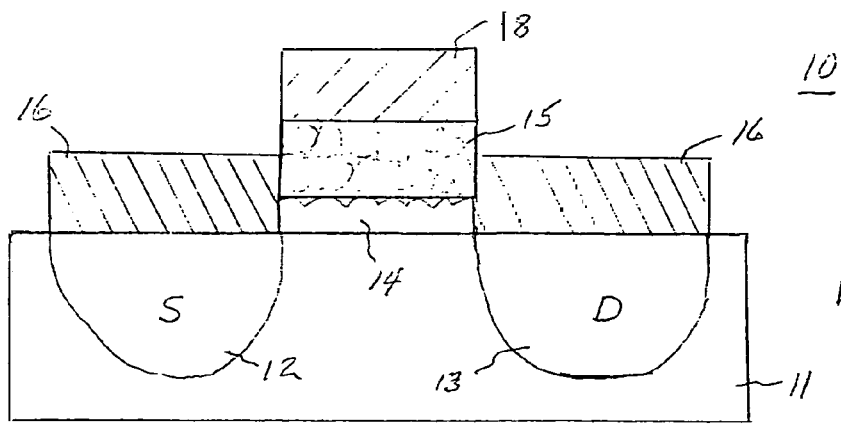
FIG. 1 is a simplified sectional view of a prior art transistor on a silicon substrate.

Turning now to the drawings, attention is first directed to FIG. 1, which illustrates a simplified sectional view of a prior art field effect transistor 10 as known in the art. Transistor 10 is formed directly on a silicon substrate 11 by forming spaced apart source (S) and drain (D) wells 12 and 13, respectively, through the surface of substrate 11. A thin gate insulating layer 14 is formed on the surface of substrate 11 between wells 12 and 13 and a gate stack 15 is formed on insulating layer 14. Metal contacts 16 are formed on each of wells 12 and 13 and a gate metal contact 18 is formed on gate stack 15 by a well known metallization process.

In this prior art device, gate insulating layer 14 is formed of a fine silicon dioxide produced directly on the surface of silicon substrate 11. To form gate stack 15 between gate metal contact 18 and insulating layer 14, a relatively thick layer of silicon is grown on the surface of insulating layer 14. As is understood in the art, growing silicon on silicon oxide results in polycrystalline silicon, illustrated simply as a plurality of single crystal islands or globules. Gate stack 15 is doped with a compatible material to provide the correct doping for the type of transistor being produced and, thus, provide the desired electrical contact with gate insulating layer 14. Typically the doping materials used are boron, gallium and aluminum (or other group III atom) for p-type (excess holes) of conductivity and arsenic, nitrogen or phosphorous (or other group VA atom) for the n-type (excess electrons) of conductivity.

The major problem with many of the doping materials, and especially boron, is that it is highly mobile after being introduced as a dopant. Typically the dopant atom is implanted to the required dose and depth. An aggressive thermal activation of the dopant at elevated temperature is subsequently required. During the dopant thermal activation the impurity tends to migrate or diffuse. Here it will be understood, as described above, that the silicon grown on the silicon diode insulating layer is generally polycrystalline silicon. Any free boron residing in gate stack 15 has a tendency to migrate through the polycrystalline formation (i.e. between the islands or globules of single crystal silicon) and into the silicon dioxide gate insulating layer. For example, boron atoms can be located between islands of single crystal silicon and will not be attached to the crystalline structure and are, thus, free to migrate into insulating layer 14. If the gate insulating layer is thick and wide, small amounts of dopant (e.g. boron) will have a small effect. However, as the gate insulating layer is reduced in length and thickness, the dopant migrating into the layer will have a greater effect.

For example, when the gate insulating layer is reduced to a few nanometers thick (e.g. 10 nm or 100 Å), boron migrating from a polycrystalline silicon stack can produce a sort of scalloped upper surface (illustrated simply in FIG. 1) with nearly periodic thinner or defect areas of gate insulator. These thinner or defect areas of gate insulating layer 14 can change the operating characteristics (e.g. the threshold voltage) of the resulting FET and substantially reduce the life. Further, because the migrating dopant or impurities are not uniform across a semiconductor wafer, the characteristics (e.g. threshold voltages) of the fabricated FETs can change substantially across the semiconductor wafer. This change across the semiconductor wafer can result in a substantial change in the threshold voltage for the FETs fabricated in different areas of the wafer, which is highly undesirable in planar processing of the semiconductor industry. Therefore, it would be highly desirable to prevent migration of impurities through the gate stack and into the gate insulating layer.

Figure 2:
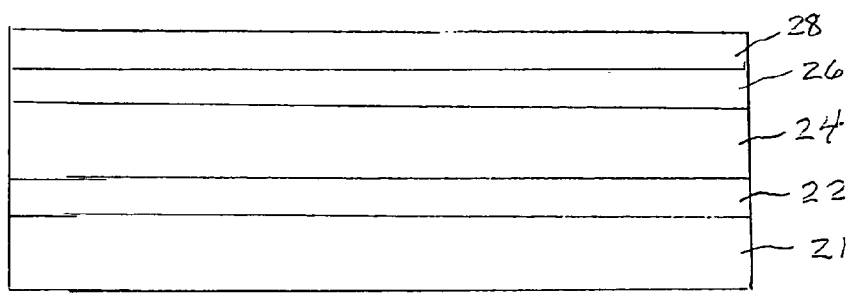
FIG. 2 is a simplified side view of a semiconductor substrate illustrating an interim point in the fabrication process of a gate stack for an improved field effect transistor in accordance with the present invention.

Turning now to FIG. 2, a simplified side view of a semiconductor substrate is illustrated showing an interim point in the fabrication process of a gate structure, designated 20, for an improved field effect transistor in accordance with the present invention. A semiconductor substrate 21 is provided that in this preferred embodiment includes single crystal (crystalline) silicon. As described in a copending U.S. patent application entitled "Transistor and In-Situ Fabrication Process", filed February, 2205, with Ser. No. 10/, and incorporated herein by reference, a silicon-on-insulator (SOI) structure can be formed by growing a layer of single crystal insulating material 22 directly on substrate 21. In the preferred embodiment single crystal insulating material 22 is a rare earth oxide or rare-earth nitride that is deposited or grown directly in a single crystal form. A thin active layer 24 (e.g. generally in a range of 150 to 500 angstroms) of single crystal silicon is deposited on the surface of single crystal insulating material 22. It should be understood that the SOI structure is preferred but gate stack 20 can be formed directly on substrate 21 or on any other desired configuration that will operate as a substrate in which a FET or similar semiconductor component can be formed. For purposes of this disclosure the term "substrate" refers to the material on which a semiconductor component is formed and may include a simple substrate or an SOI structure.

A gate insulating layer 26 of single crystal rare earth insulating material (rate earth oxide, nitride, oxynitride, etc.) is epitaxially deposited or grown directly on the surface of active layer 24. While any of the materials known as "rare earths" can be used, two preferred examples are Erbium (Er) and Ytterbium (Yb). Other typical examples of rare earth materials that can be used in the application are described in U.S. provisional application No. 60/533378, filed 29 Dec. 2003, incorporated herein by reference. All of the above described materials (e.g. rare earth oxide, rare earth nitride, rare earth oxynitride, etc.) are referred to in this disclosure generally as "rare earth insulators" or as "rare earth insulating materials".

Single crystal rare earth oxides and rare earth nitrides, as well as other rare earth insulating materials, can be grown on silicon substrates with a (111), (001), or (110) crystalline orientation, and on Si (001) oriented substrates miscut between 1-6 degrees. These rare earth forms of insulating material possess unique qualities, e.g., single crystal morphology, large intrinsic energy band gap, and high dielectric constant.

Here it should be understood that layer 26 is epitaxially deposited and because it is a single crystal rare earth insulator it is an extremely good insulator with low leakage and it can be chosen to be lattice matched crystallographically to the single crystal silicon so that there is little or no stress between the adjacent layers. Thus, the thickness can be chosen to be virtually any thickness (generally from a few angstroms, i.e. one or two atoms, to 100 Å or more) to provide the desired FET characteristics. Further, the rare earth insulators are highly resistant to migration of impurities into or through layer 26.

In a next step, which generally can be performed in-situ (i.e. without removing substrate 21 from the epitaxial chamber), a layer 28 of single crystal silicon is epitaxially deposited on the surface of gate insulating layer 26. Layer 28 can be doped in any desirable process including, for example, incorporating the dopant at the time of deposit or implanting a dopant later, with boron or any other selected dopant to provide the desired conductivity. Because layer 28 is single crystal silicon, migration of the dopant material within layer 28 or out of layer 28 and into layer 26 is prevented or reduced substantially. That is, boron atoms residing in the single crystal structure will tie into the crystal bonds and, thus, be a part of the crystalline structure and not be free to move.

The dopant diffusion coefficient which is a measure of the rate of dopant atom migration during thermal activation is many orders of magnitude less in single crystalline silicon compared to polycrystalline and or amorphous silicon.

Also, the rare earth insulator of layer 26 prevents migration of dopant materials or other impurities into layer 26 or through layer 26 and into active layer 24.

Figure 3:
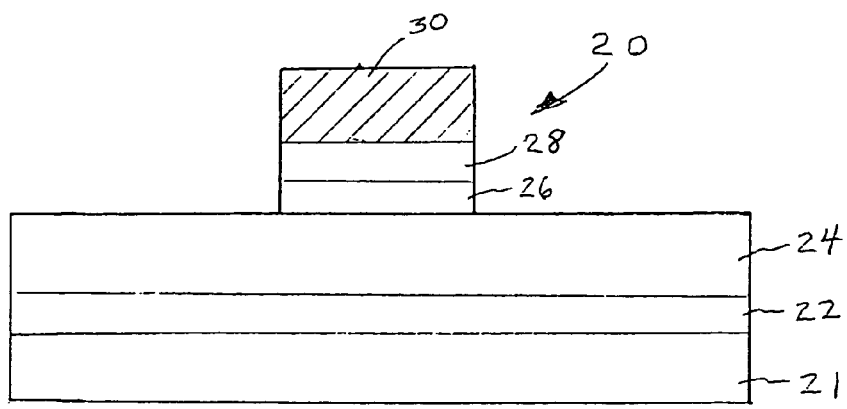
FIG. 3 is a side view of another interim point in the fabrication of a semiconductor field effect transistor in accordance with the present invention.

Referring additionally to FIG. 3, the structure on substrate 21 can be patterned and etched to define gate structure 20 and then metallized to form electrical contact 30. Alternatively, the structure on substrate 21 can be patterned and metallized and then etched using the metallization as a pattern. Other fabrication variations can be devised but the result is gate structure 20 including gate insulating layer 26, gate stack 28, and gate metal contact 30 as illustrated. In this configuration, single crystal rare earth insulating layer 26 is a very good gate insulator and substantially lattice matches with silicon active layer 24 to improve operating characteristics and to reduce stresses. Also, because insulating layer 26 is single crystal, a gate stack 28 of single crystal silicon can be epitaxially grown. Because gate stack 28 is single crystal silicon any impurities or dopant materials introduced to provide the desired conductivity will generally be firmly tied into the crystalline structure and will not migrate into the gate insulator. However, any loose or free impurities have a strong tendency not to migrate in the single crystal structure.

A semiconductor component, such as a FET, can be completed in active layer 24 by simply forming a source and a drain in some convenient process. For example, a source and drain can be formed by diffusion or implanting of a selected dopant material into the areas at either side of gate structure 20. Because of the novel process and construction of gate structure 20, the source and gate areas can be formed near the end of the FET fabrication process rather than as an initial step. Also, a thickness of active layer 24 can be selected so that a fully depleted FET is formed or a partially depleted FET can be formed. Alternatively, by eliminating the SOI structure a simple FET with no depletion can be formed. Thus, it will be understood by those skilled in the art, that the process for fabricating FETs and other semiconductor components has been substantially improved and simplified.

Thus, a new and improved method of fabricating semiconductor components has been disclosed. Also, new and improved semiconductor components including new and improved gate structures have been disclosed. Because of the improved insulating characteristics of rare earth insulating materials and because of the ability to control various characteristics of each layer in a semiconductor component (e.g. thickness and high K dielectric gate oxides) further scaling or reduction in size of CMOS architecture is possible. Also, because of the rare earth insulators utilized as the gate insulating layer, migration of dopant materials is eliminated and transistor characteristics are standardized over entire wafers to improve operating characteristics and life. Further, the steps in fabricating processes for FETs and the like can be substantially simplified by forming components, such as the source and drain areas as a later step in the process.

Various changes and modifications to the embodiment herein chosen for purposes of illustration will readily occur to those skilled in the art. To the extent that such modifications and variations do not depart form the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A method of fabricating a gate structure for semiconductor components comprising the steps of:
   providing a crystalline semiconductor substrate;
   epitaxially growing a gate insulating layer of crystalline rare earth insulating material on the semiconductor substrate;
   epitaxially growing a gate stack of crystalline semiconductor material on the layer of crystalline rare earth insulating material, doping the gate stack of crystalline semiconductor material to provide a desired type of conductivity; and
   etching the gate insulating layer and the gate stack and depositing a metal contact on the crystalline gate stack of crystalline semiconductor material.

2. A method as claimed in claim 1 wherein the step of providing the crystalline semiconductor substrate includes providing a crystalline silicon substrate.

3. A method as claimed in claim 2 wherein the step of providing the crystalline semiconductor substrate includes providing a crystalline silicon substrate with silicon-on-insulator construction.

4. A method as claimed in claim 1 wherein the step of epitaxially growing the gate insulating layer of crystalline rare earth insulating material includes using one of erbium and ytterbium.

5. A method as claimed in claim 1 wherein the step of epitaxially growing the gate stack of crystalline semiconductor material includes epitaxially growing crystalline silicon.

6. A method as claimed in claim 5 wherein the step of doping the gate stack of crystalline semiconductor material includes doping the crystalline silicon with boron.

7. A method as claimed in claim 1 wherein the method includes fabricating a gate structure for a field effect transistor.

8. A method as claimed in claim 7 wherein the method of fabricating the gate structure for the field effect transistor further includes a step of forming source and drain areas in the substrate on opposite sides of the gate structure subsequent to forming the gate structure.

9. A method of fabricating a gate structure for a field effect transistor comprising the steps of:
   providing a crystalline silicon substrate;

epitaxially growing a gate insulating layer of crystalline rare earth insulating material on the crystalline silicon substrate;

epitaxially growing a gate stack of crystalline silicon on the layer of crystalline rare earth insulating material, doping the gate stack of crystalline silicon to provide a desired type of conductivity; and etching the gate insulating layer of crystalline rare earth insulating material and the gate stack of crystalline silicon and depositing a metal contact on the epitaxially grown gate stack of crystalline silicon to define a gate structure.

10. A method as claimed in claim 9 further including a step of forming source and drain areas in the substrate on opposite sides of the gate structure subsequent to forming the gate structure.

11. A method as claimed in claim 9 wherein the step of doping the gate stack of crystalline silicon material includes doping the crystalline silicon with boron.

12. A method as claimed in claim 9 wherein the step of epitaxially growing the gate insulating layer of crystalline rare earth insulating material includes using one of erbium and ytterbium.

13. A method as claimed in claim 3 wherein the step of providing silicon-on-insulator substrate is formed by depositing single crystal rare earth insulator on a crystalline silicon substrate, and further depositing single crystal silicon on the single crystal rare earth insulator.

* * * * *